US012326765B1

(12) United States Patent
Valdez et al.

(10) Patent No.: US 12,326,765 B1
(45) Date of Patent: Jun. 10, 2025

(54) SUBMERSIBLE NETWORKING ENCLOSURE

(71) Applicant: FRONTIER COMMUNICATIONS HOLDINGS, LLC, Dallas, TX (US)

(72) Inventors: John Valdez, Copper Canyon, TX (US); Erwin Wardojo, McKinney, TX (US)

(73) Assignee: FRONTIER COMMUNICATIONS HOLDINGS, LLC, Dallas, TX (US)

( * ) Notice: Subject to any disclaimer, the term of this patent is extended or adjusted under 35 U.S.C. 154(b) by 0 days.

(21) Appl. No.: 18/773,778

(22) Filed: Jul. 16, 2024

(51) Int. Cl.
*G06F 1/20* (2006.01)
*H05K 7/20* (2006.01)

(52) U.S. Cl.
CPC ............ *G06F 1/20* (2013.01); *H05K 7/20218* (2013.01); *H05K 7/20781* (2013.01); *G06F 2200/201* (2013.01)

(58) Field of Classification Search
CPC ........... H05K 7/20236; H05K 7/20272; H05K 7/20781; H05K 7/203; H05K 7/20736; H05K 7/20254; H05K 7/20818; H05K 7/1488; H05K 7/1491; H05K 7/1489; H05K 7/20327; H05K 7/20709; G06F 1/20; G06F 2200/201; H01L 23/44; H01L 23/473; F28D 2021/0028
USPC ...................................................... 361/701
See application file for complete search history.

(56) References Cited

U.S. PATENT DOCUMENTS

| 4,116,268 | A | * | 9/1978 | Kruger | F28F 9/02 |
| | | | | | 165/104.31 |
| 4,320,431 | A | | 3/1982 | Bell | |
| 6,407,533 | B1 | | 6/2002 | Bartek et al. | |
| 7,475,494 | B1 | | 1/2009 | Knight et al. | |
| 9,351,429 | B2 | * | 5/2016 | Shelnutt | H05K 7/203 |
| 10,064,313 | B2 | | 8/2018 | Ishinabe | |
| 10,528,094 | B2 | | 1/2020 | Saito | |
| 10,750,637 | B1 | | 8/2020 | Alissa et al. | |
| 2011/0132579 | A1 | * | 6/2011 | Best | H05K 7/20836 |
| | | | | | 165/104.31 |
| 2014/0022708 | A1 | * | 1/2014 | Hyde | F24T 10/40 |
| | | | | | 361/677 |
| 2014/0307384 | A1 | * | 10/2014 | Best | H05K 7/1497 |
| | | | | | 361/679.53 |

(Continued)

FOREIGN PATENT DOCUMENTS

CN    111356343 A    6/2020

*Primary Examiner* — Mandeep S Buttar
(74) *Attorney, Agent, or Firm* — MARSHALL, GERSTEIN & BORUN LLP

(57) ABSTRACT

An subterranean enclosure for retaining at least one networking component may include a shell forming a first chamber and a second chamber, a dielectric fluid adapted to be disposed in the first chamber, a mounting mechanism at least partially disposed within the first chamber, a coolant distribution line at least partially disposed within the first chamber, a coolant circulator at least partially disposed within the shell, and a heat exchanger operably coupled with the shell. The shell includes a plurality of sidewalls and is disposed in a subterranean environment. The heat exchanger is adapted to dissipate thermal energy from the dielectric fluid exiting the coolant circulator prior to the dielectric fluid entering the coolant distribution line, and extends outwardly from the shell.

20 Claims, 3 Drawing Sheets

(56) References Cited

U.S. PATENT DOCUMENTS

| | | | |
|---|---|---|---|
| 2015/0000319 A1* | 1/2015 | Smith | H05K 7/20236 |
| | | | 165/45 |
| 2015/0181762 A1 | 6/2015 | Boyd et al. | |
| 2016/0234970 A1 | 8/2016 | Shelnutt et al. | |
| 2017/0223870 A1* | 8/2017 | Smith | F28D 20/0052 |
| 2017/0311484 A1 | 10/2017 | Ozyalcin et al. | |
| 2018/0063991 A1 | 3/2018 | Hirai et al. | |
| 2019/0014685 A1 | 1/2019 | So et al. | |
| 2019/0219311 A1* | 7/2019 | Smith | H05K 7/20236 |
| 2019/0223324 A1* | 7/2019 | Le | H05K 7/20263 |
| 2019/0357385 A1 | 11/2019 | Miyazaki | |
| 2020/0015383 A1* | 1/2020 | Gao | H05K 7/20763 |
| 2020/0093037 A1* | 3/2020 | Enright | H05K 7/20381 |
| 2020/0093038 A1* | 3/2020 | Enright | H05K 7/20318 |
| 2020/0288600 A1 | 9/2020 | Gao | |
| 2022/0104394 A1 | 3/2022 | Boyd et al. | |
| 2022/0361381 A1 | 11/2022 | Sweeney et al. | |
| 2022/0400577 A1* | 12/2022 | Smith | H05K 7/20236 |
| 2023/0042343 A1* | 2/2023 | Hashimoto | H05K 7/20272 |
| 2023/0225076 A1* | 7/2023 | Shah | H05K 7/20736 |
| | | | 361/679.53 |
| 2023/0254996 A1 | 8/2023 | Johnson | |
| 2023/0363110 A1 | 11/2023 | Testa et al. | |
| 2024/0260228 A1* | 8/2024 | Chuang | H05K 7/20818 |
| 2024/0292573 A1 | 8/2024 | Kajitani et al. | |

* cited by examiner

SUBMERSIBLE NETWORKING ENCLOSURE

FIELD OF THE DISCLOSURE

This disclosure relates generally to networking systems, and, more particularly, to submersible enclosures for networking systems.

BACKGROUND

Telecommunication networking elements may oftentimes require cooling to maintain operational specifications. Given an increase in technological demands relating to higher capacity and increased processing power, power consumption and heat output are oftentimes significantly increased.

Historically, telecommunications companies have deployed active networking equipment in outside plant (OSP) environments. When deploying sensitive active networking equipment in a digital loop carrier (DLC) cabinet, heat and power demands pose challenges, as a balance is ideally met between cooling the equipment while not overtaxing the cooling mechanism. Frequently, such elements are air-cooled using: 1) any number of suitable fans to circulate air; 2) with a heat exchanger; and/or 3) with any number of air conditioning units. However, each of these approaches relies on controlling air circulation as a primary method to remove heat from inside the cabinet or enclosure. Such approaches may consume significant amounts of energy and require relatively large enclosures, thereby increasing material and equipment costs. Further, service providers may need to routinely repair and/or replace such devices, which may increase overall costs and resources.

Accordingly, there is a need for improved devices having improved functionalities.

SUMMARY

In accordance with a first aspect, the techniques described herein relate to a subterranean enclosure for retaining at least one networking component. The subterranean enclosure may include: a shell forming a first chamber and a second chamber, the shell including a plurality of sidewalls and being disposed in a subterranean environment; a dielectric fluid adapted to be disposed in the first chamber; a mounting mechanism at least partially disposed within the first chamber, the mounting mechanism including at least one coupling member adapted to retain at least one active networking component; a coolant distribution line at least partially disposed within the first chamber of the shell, the coolant distribution line including an elongated member having at least one opening formed on a portion thereof; a coolant circulator at least partially disposed within the shell, the coolant circulator adapted to circulate the dielectric fluid within the first chamber of the shell via the coolant distribution line; and a heat exchanger operably coupled with the shell, the heat exchanger positioned near an exterior portion of the shell and being adapted to dissipate thermal energy from the dielectric fluid exiting the coolant circulator prior to the dielectric fluid entering the coolant distribution line. The heat exchanger extends outwardly from the shell.

In some examples, the heat exchanger may extend outwardly from the shell in a generally parallel direction to at least one of the plurality of sidewalls. Further, in some examples, the subterranean enclosure may include a porous material disposed between the shell and heat exchanger. The porous material may include at least one of a gravel material or a fibrous material.

In some arrangements, the heat exchanger may include at least one heat sink having a plurality of fins and at least one support bar adapted to position the at least one heat sink a distance away from the plurality of sidewalls.

In forms, the mounting mechanism is adapted to be submerged in the dielectric fluid. Additionally, in some forms, the subterranean enclosure may include a connection panel at least partially disposed in the second chamber of the shell, the connection adapted to be accessible by a user via a door. In these and other examples, the subterranean enclosure may further include at least one transmission cable that is adapted to operably couple with the at least one active networking component retained in the first chamber and the connection panel disposed in the second chamber.

In some examples, the subterranean enclosure may further include a primary power source at least partially disposed within the first chamber. The primary power source is adapted to be submerged in the dielectric fluid and to provide power to the at least one active networking component. Further, in some examples, the subterranean enclosure may also include a secondary power source at least partially disposed within the second chamber. The secondary power source is adapted to provide power to the at least one active networking component.

In some aspects, the subterranean enclosure may further include a cover adapted to seal the first chamber and the second chamber of the shell.

In accordance with a second aspect, approaches for assembling a subterranean enclosure for retaining at least one networking component include providing a shell forming a first chamber and a second chamber. The shell includes a plurality of sidewalls. The approach further includes coupling a mounting mechanism with the first chamber of the shell, the mounting mechanism including at least one coupling member and disposing a coolant distribution line within the first chamber of the shell, the coolant distribution line including an elongated member having at least one opening formed on a portion thereof. At least one active networking component is coupled with the mounting mechanism via the at least one coupling member, and a coolant circulator is coupled with the shell. Further, a heat exchanger is coupled with an exterior portion of the shell such that a gap is defined between the heat exchanger and at least one of the plurality of sidewalls. The heat exchanger is adapted to dissipate thermal energy from the dielectric fluid exiting the coolant circulator prior to the dielectric fluid entering the coolant distribution line. The subterranean enclosure is disposed in a subterranean environment, and a dielectric fluid is disposed within the first chamber of the shell such that the at least one active networking component is submerged by the dielectric fluid.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate examples of concepts that include the claimed invention, and explain various principles and advantages of those examples.

Figure 1:
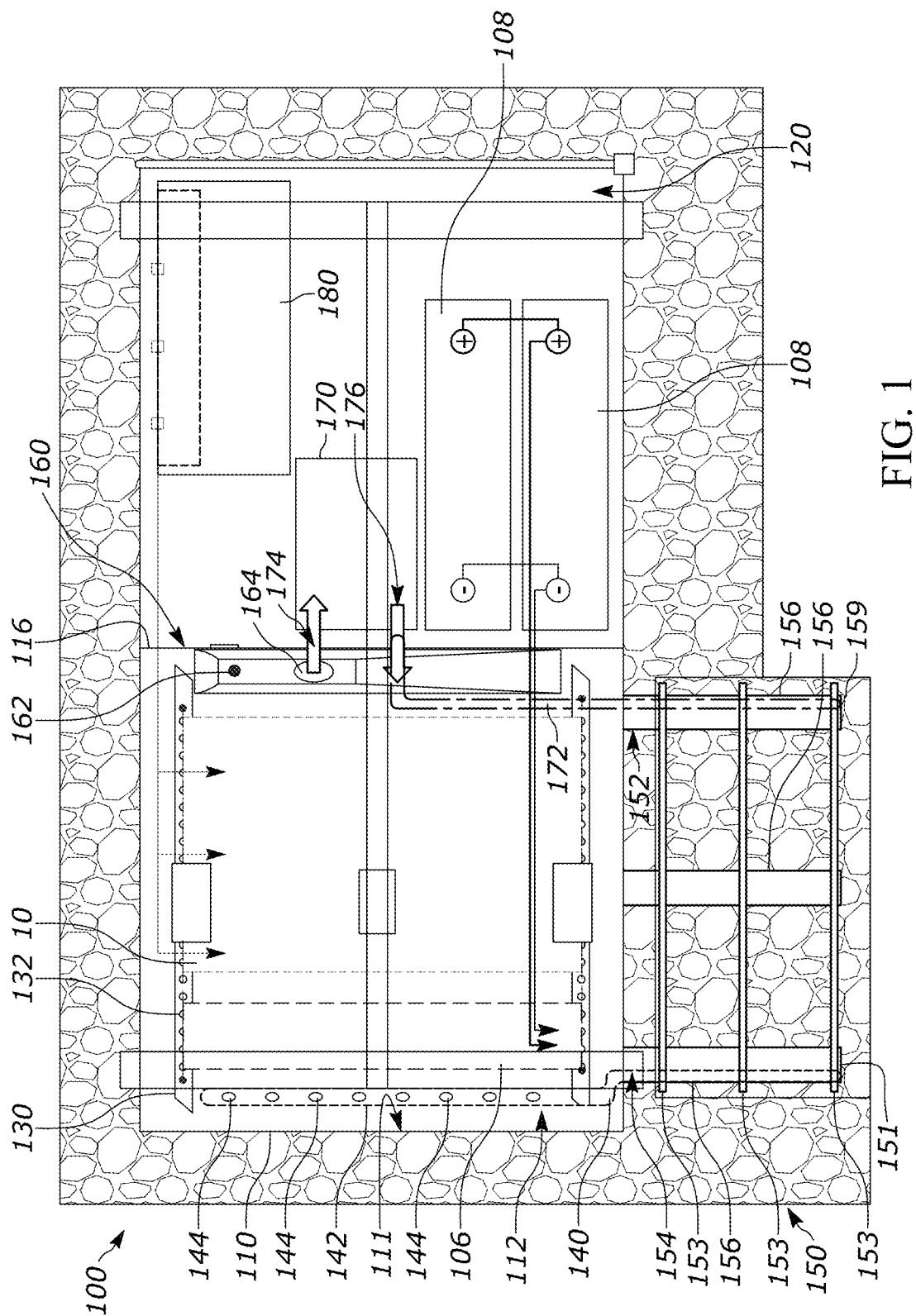
FIG. 1 is a top plan view of an example subterranean enclosure for retaining at least one networking component in which the systems, methods, and/or techniques of the present disclosure may be implemented.
Figure 2:
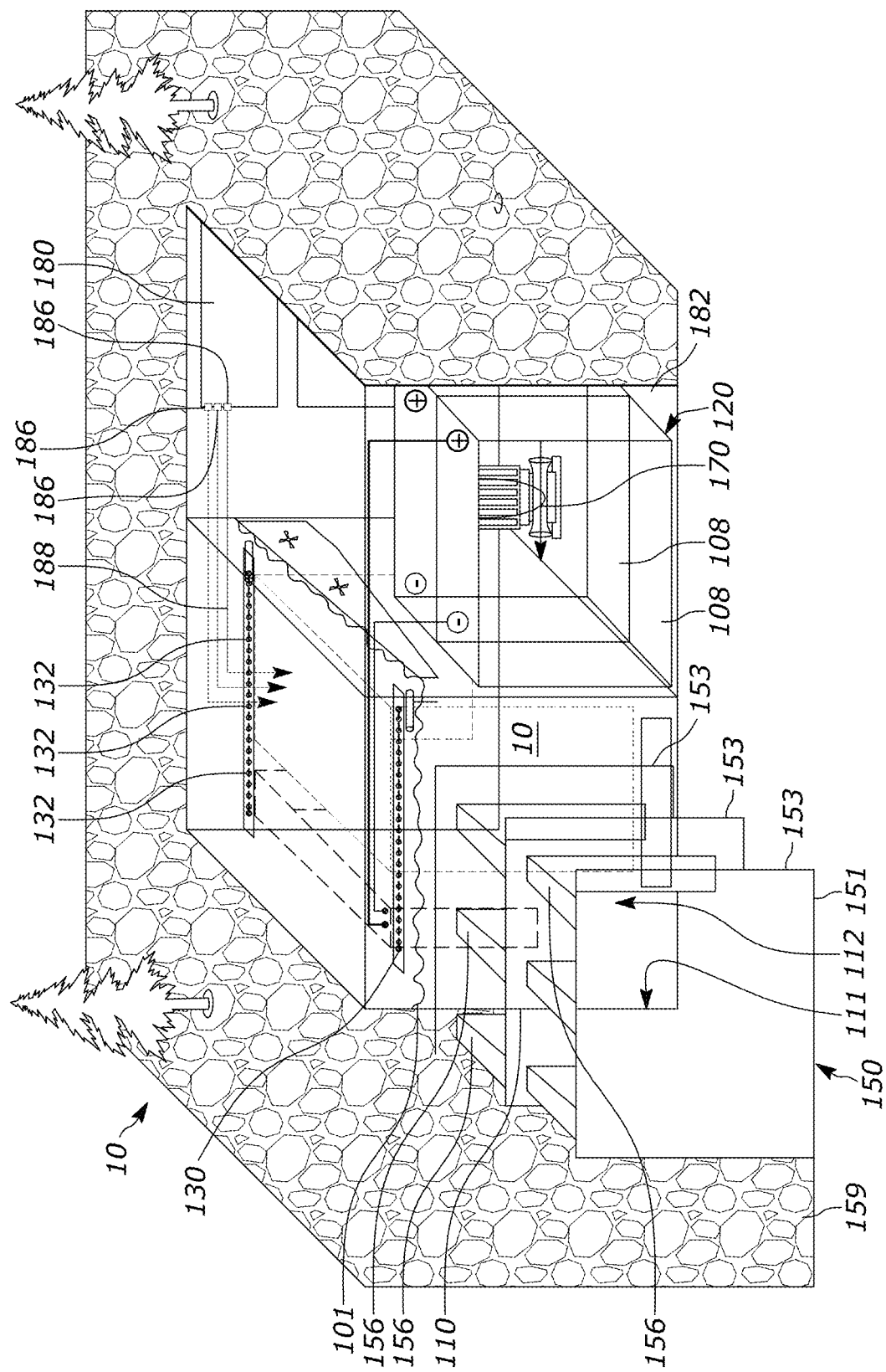
FIG. 2 is a perspective view of the example enclosure of FIG. 1 in a partially-assembled configuration in accordance with various examples.
Figure 3:
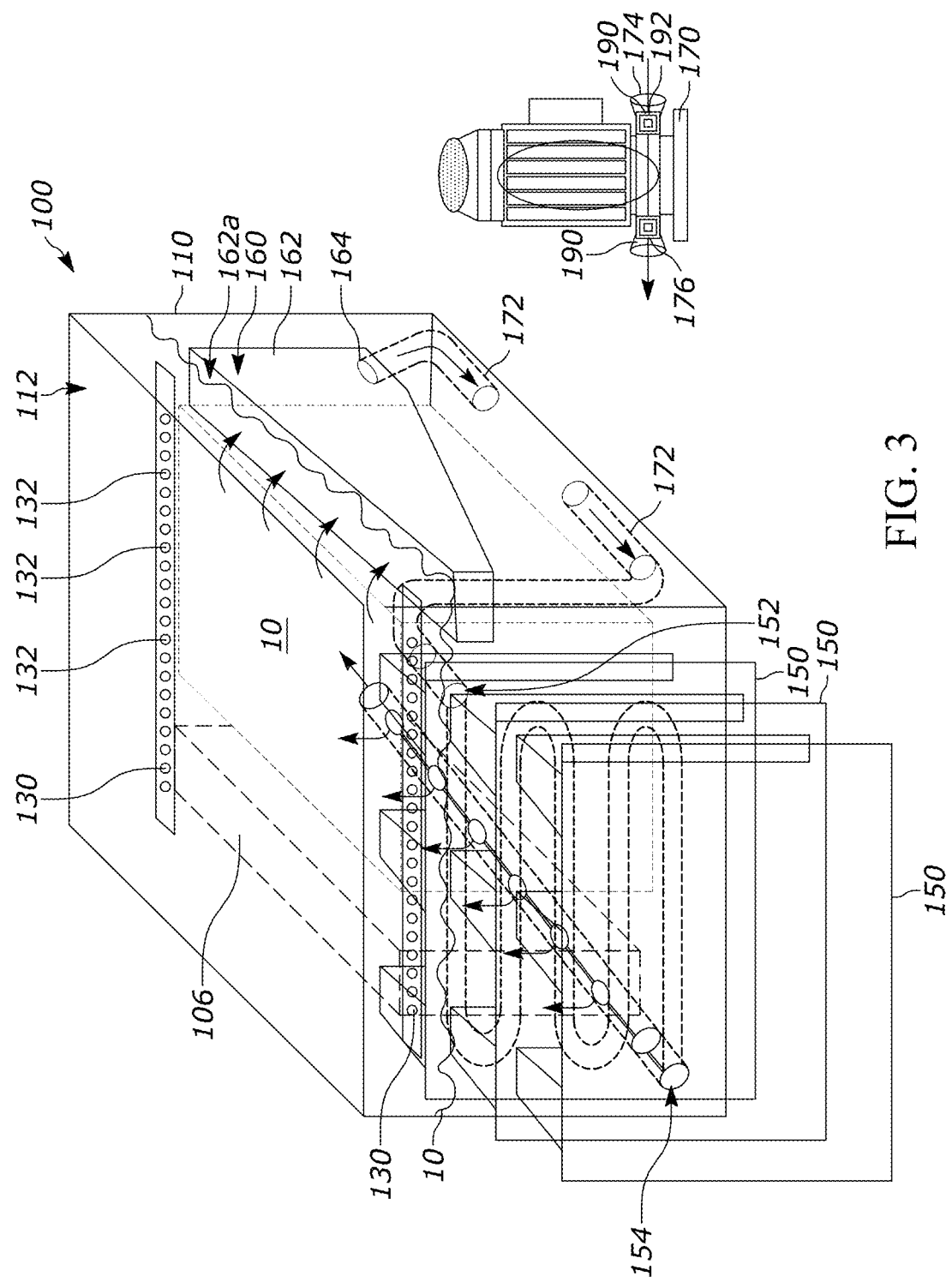
FIG. 3 is a perspective view of a portion of the example enclosure of FIGS. 1 & 2 in accordance with various examples.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples. Also, common but well-understood elements that are useful or necessary in a commercially feasible examples are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

The apparatus and method components have been represented where appropriate by conventional symbols in the drawings, showing only those specific details that are pertinent to understanding examples of the present disclosure so as not to obscure the disclosure with details that will be readily apparent to those of ordinary skill in the art having the benefit of the description herein.

Although the figures show parts with clean lines and boundaries, some or all of these lines and/or boundaries may be idealized. In reality, the boundaries and/or lines may be unobservable, blended, and/or irregular. Use of terms such as up, down, top, bottom, side, end, front, back, etc. herein are used with reference to a currently considered or illustrated orientation. If they are considered with respect to another orientation, it should be understood that such terms must be correspondingly modified.

DETAILED DESCRIPTION

Disclosed examples of the disclosure provide a number of advantages over existing techniques for retaining components of networks while providing for increased thermal dissipation. Generally speaking, a component of a network, such as, for example, a PON, as utilized herein, which may be in the form of a last mile termination unit (e.g., an optical network terminal (ONT), an optical network unit (ONU), and/or an optical line terminal (OLT)) disposed at customer premises). Such a component may be retained within an enclosure. The enclosures described herein may accommodate advanced and/or higher-powered networking components while allowing for adequate heat dissipation to reduce and/or eliminate occurrences of overheating or other damaging events. More specifically, the enclosure may incorporate multiple chambers, one of which being adapted to retain a dielectric fluid that may take advantage of thermal conductivity properties to efficiently and effectively remove thermal energy generated from the networking equipment retained within the enclosure. Additionally, by using fluid to cool the networking equipment, such fluid may provide additional and insulation protection from external forces such as accidental contact (e.g., from a vehicle hitting the enclosure) and/or from other forces such as vibrational and/or electrical shocks and/or pulses. The enclosures described herein may also allow a user (e.g., a service technician) to access, modify, and/or create data connections with the networking equipment while the networking equipment remains submerged within the dielectric fluid in its respective chamber, thereby reducing overall maintenance and/or service times while also limiting exposure to the networking equipment.

Notably, to assist with improving efficiency in heat exchange operations, the enclosures described herein are disposed in a subterranean environment, that is, they are placed below grade with the heat exchanger spaced outwardly from the enclosure while being deployed in contact with a porous substance with inherent heat-distributing properties. Burying the cabinet & the heat exchanger below grade may ensure lower ambient temperatures due to the below grade soil temperature being cooler than aboveground ambient air temperatures.

Turning now to the Figures, an enclosure 100 is provided for retaining at least one networking component 10 (e.g., an ONT, ONU, OLT, and/or any other networking devices such as transport and/or data center equipment, which may include reconfigurable optical add-drop multiplexers (ROADM), ethernet, router, and/or server devices). The enclosure 100 may include a shell 110 including a number of sidewalls 110a and having a first chamber 112 and a second chamber 120 separated by a partition 116. It is to be appreciated that the shell 110 may include any number of additional chambers as desired. Generally speaking, the first chamber 112 is adapted to retain the active networking component 10 in addition to any other components that may benefit from thermal energy dissipation. In some examples, the shell 110 may be constructed from any number and/or combination of rigid, fluid impermeable materials such as, for example, metals, polymers, and or any combination of these or other suitable materials that may retain a fluid therein while restricting the fluid from leaking or otherwise flowing to an exterior region thereof. In some examples, the shell 110 may additionally include a lining 111 constructed from a fluid impermeable material such as, for example, a silicone material, a rubber material, a polymeric material, and the like. Other examples are possible. Such a lining may prevent any fluids disposed therein from inadvertently leaking from the shell 110. While the illustrated enclosure 100 is in the form of a generally rectangular box, it is to be appreciated that the enclosure 100 may take any number of suitable shapes, forms, and/or configurations. Further, in the illustrated examples, the shell 110 may have an overall length dimension between approximately 1 m-2 m, and a width dimension between approximately 0.5 m-1 m. However, other examples are possible.

The enclosure 100 further includes a mounting mechanism 130 used to couple the networking component 10 therewith. In some examples, the mounting mechanism 130 may include at least one coupling member 132 in the form of a track, rail, or similar rack member operably coupled with the shell 110 (e.g., a sidewall or floor member thereof) that may slidably receive a corresponding bracket member (not illustrated) coupled with or otherwise formed on the networking component 10. The mounting mechanism 130 may take any number of suitable shapes or arrangements to accommodate any desired quantity of networking equipment 10 having varying dimensions and/or orientations. It is to be appreciated that any number of suitable approaches may be used to couple the networking component 10 with the mounting mechanism 130.

As previously noted, the first chamber 112 may be arranged to receive any number of components (e.g., active networking components 10 and any other elements). In addition to these active networking components 10, the first chamber 112 may also be dimensioned to accommodate a primary power source 106. In some examples, the primary power source 106 may be in the form of a direct current ("DC") power supply capable of providing between approximately 200-400 Ah of power. In some approaches, Lithium Iron Phosphate (LiFePO4) battery banks may be provided. Other examples are possible, depending on the desired requirements of the enclosure 100.

The first chamber 112 accommodates a dielectric fluid 101. Advantageously, the dielectric fluid 101 remains electrically nonconductive, and as such, may allow electronic components (such as, for example, the networking component(s) 10, the primary power source 106, and/or any other desired components at least partially disposed within the first chamber 112) to be disposed therein without incurring damage thereto while transferring generated thermal energy (e.g., heat) therefrom. It is to be appreciated that any number of suitable dielectric fluids 101 may be used, such as, for example, non-compressible, isotropic, Newtonian fluids having a dielectric strength of greater than approximately 60 kV and a resistivity of greater than 1×1014. Further, the dielectric fluid 101 may have a dielectric constant between approximately 2.0 and 2.5, with a density between approximately 0.80 and 0.85 g/cc at 20° C. Further, in some examples, the dielectric fluid 101 may have a coefficient of thermal expansion between approximately 0.0007 and 0.0006 volume/C, and a thermal conductivity between approximately 0.13 and 0.16 W/mK at 60° C. Other examples are possible.

A coolant distribution line 140 is also at least partially disposed within the first chamber 112. In the illustrated examples, the coolant distribution line 140 includes an elongated member 142 having at least one opening 144 or hole formed thereon. As will be discussed in further detail herein, the coolant distribution line 140 is provided to distribute cooled dielectric fluid 101 into the first chamber 112 of the shell 110.

A heat exchanger 150 is also operably coupled with the shell 110. In some examples, the heat exchanger 150 may be in the form of a heat sink or radiator 151 having a number of fins 153 arranged to dissipate thermal energy from the dielectric fluid 101 to an external ambient air environment. The heat exchanger 150 may include internal tubing and/or may define a fluid flow path that accommodates and causes the dielectric fluid 101 to flow from an inlet 152 to an outlet 154 thereof. As illustrated in the Figures, the outlet 154 of the heat exchanger 150 is operably coupled with the coolant distribution line 140 such that the dielectric fluid 101 enters the fluid distribution line 140 upon being thermally cooled by the heat exchanger 150. In some examples, the shell 110 may include an opening that allows the outlet 154 of the heat exchanger 150 and/or a portion of the fluid distribution line 140 to be inserted therethrough to permit the dielectric fluid 101 to enter the first chamber 112. Such an opening may be sealed via any suitable approach to prevent unintended leakage of the dielectric fluid 101. It is to be appreciated that any number of heat sinks, heat exchangers, radiators, and the like may be provided.

Further, as illustrated in the Figures, the heat exchanger 150 includes any number of support bars 156 that allow the fins 153 to be disposed away from the sidewall(s) 110a of the shell 110. More specifically, the support bars 156 may be constructed from a rigid material capable of securely positioning the fins 153 in a desired orientation. The support bars 156 may be operably coupled with the desired sidewall or sidewalls 110a of the shell 110 via any number of suitable approaches, such as, for example, brackets, flanges, fasteners, and the like. In some arrangements, the support bars 156 may be constructed from metals such as aluminum due to their heat dissipation properties, but any number of alternative examples are possible. As illustrated in the Figures, when assembled, in some forms, the heat exchanger 150 may extend outwardly from and generally parallel to the desired sidewall 110a.

In some examples, the fins 153 may be provided with passthrough regions 153a in the form of openings to allow the support bars 156 to be inserted therethrough. In some arrangements, the support bars 156 may be in the form of a number of discrete members (not illustrated) that are secured to a portion of the fins 153 on one or more sides thereof. Other arrangements are possible.

The heat exchanger 150 additionally incorporates a porous material 159 that at least partially surrounds all or a portion of the heat sink 151. More specifically, in some arrangements, the porous material 159 may be in the form of porous pebbles that are disposed adjacent to and/or in between the fins 153 to maximize contact with a cooler environment. In some forms, the porous material 159 may be in the form of gravel or a fibrous material. Other arrangements are possible.

An overflow assembly 160 is also provided to retain and assist with circulating the dielectric fluid 101. In some arrangements, portions of the overflow assembly 160 are disposed within the first chamber 112 of the shell 110, and other portions of the overflow assembly 160 are disposed within the second chamber 120 of the shell 110. In some arrangements, the overflow assembly 160 may include a trough 162 having an open upper end 162a and an outlet 164. This trough 162 may be disposed within the first chamber 112. As will be discussed further below, the open upper end 162a of the trough 162 is arranged to receive dielectric fluid 101 having a higher thermal temperature due to being in contact with the active networking component(s) 10.

A coolant circulator 170 is provided in the form of a pumping mechanism. In the illustrated examples, the coolant circulator 170 is disposed within the second chamber 120 of the shell 110. However, in other arrangements, the coolant circulator 170 may be disposed within the first chamber 112 and/or positioned externally to the shell 112. The coolant circulator 170 includes a number of fluid lines 172 that fluidly couple components with an inlet 174 and/or an outlet 176 thereof. More specifically, in some arrangements, the outlet 164 of the trough 162 may be fluidly coupled with the inlet 174 of the coolant circulator 170 via a first fluid line 172. Further, in some arrangements, the outlet 176 of the coolant circulator 170 may be fluidly coupled with the inlet 152 of the heat exchanger 150 via a second fluid line 172. It is to be appreciated that the fluid lines 172 may be constructed from any number of suitable materials such as, for example, flexible tubing, rigid tubing, and the like.

Further, it is to be appreciated that in the illustrated examples, the fluid lines 172 are arranged to transfer the dielectric fluid 101 between the first chamber 112 and the second chamber 120. In such arrangements, the fluid lines 172 may be inserted through a hole or other opening (not illustrated) formed in the partition 116 which may include any number of sealing mechanisms (not illustrated) incorporated thereon to prevent unintentional leakage. In other examples, the partition 116 may include a flange or other suitable coupling mechanism (not illustrated) that receives discrete portions of the fluid lines on each side of the partition 116. Other arrangements are possible.

In addition to the coolant circulator 170, the second chamber 120 may also accommodate a secondary power source 108. In some examples, the secondary power source 108 may be in the form of a direct current ("DC") power supply capable of providing similar levels of power as the primary power source 106. In other arrangements, the secondary power source 108 may provide more or less power than the primary power source 106 as desired. In the event of damage or other disruption of power from the primary power source 106, the secondary power source 108 may be arranged to automatically begin providing power to the active networking components 10 and/or any other components of the enclosure 100. Other examples are possible, depending on the desired requirements of the enclosure 100.

The second chamber 120 of the shell 110 may also include a connection panel 180. In contrast to the components (e.g., the active networking component 10) disposed within the first chamber 112, the connection panel 180 is adapted to be accessible by a user to make necessary data connections to external equipment. Put differently, the second chamber 120 may be a "high-touch" chamber that may be readily accessible by users as needed to establish and/or modify data connections. The connection panel 180 may include any number of inputs and outputs (e.g., between approximately 24 and 200 inputs and/or outputs) as desired.

The active networking components 10 are operably coupled with the connection panel 180 via any number of transmission cables 184. For example, the transmission cable(s) 184 may be in the form of fiber optic cables, power cables, and the like. Other examples include copper cables such as ethernet Cat6, coaxial, and the like. In some arrangements, the active networking component(s) 10 may be oriented "face-up" such that the connection ports on the active networking components 10 are either not submerged within the dielectric fluid 101 or are positioned just below the height of the fluid level. So arranged, the transmission cables 184 may be easily routed from the first chamber 112 to the second chamber 120. In some examples, the partition 116 may not extend the total height of the shell 110 such that the transmissions cables 184 may be routed over the partition 116. In other examples, the partition 116 may include additional holes or openings that allow the transmission cables 184 to pass therethrough. It is to be appreciated that any number of approaches for sealing the opening(s) to prevent the dielectric fluid 101 from entering the second chamber 120 may be provided.

The connection panel 180 may include any number of ports or couplings 186 as desired to allow for data transmission to the active networking component(s) from an external environment and vice-versa. Generally, the connection panel 180 provides networking connectivity originating from a serving central office (CO). Such networking connectivity typically is provided via fiber optics cables. Further, the connection panel 180 may also provide outbound networking connectivity to customer-facing outside plant hubs. The connection panel 180 may operate as a demarcation point to provide cross-connections. In some examples, the connection panel 180 may be arranged such that the couplings 186 are disposed through an opening of the second chamber 120 of the shell 110 such that the shell 110 needn't be opened to access such ports. However, in other examples, the couplings 186 of the connection panel 180 may be disposed within the second chamber, and may be accessible via a door 182 that provides access to the second chamber 120 of the shell 110. In some examples, the door 182 may selectively provide access to the first chamber 112 of the shell 110. In other examples, a separate door (not illustrated) may be provided to ensure the first chamber 112 remains "low-touch" and is not opened or otherwise unnecessarily accessed.

In operation, a user (e.g. a service technician) may dispose the enclosure 100 in a desired off-site, subterranean (e.g., below grade) location such that the heat exchanger 150 is disposed outwardly from the shell 110. In some arrangements, the shell 110 and heat exchanger 150 may be pre-assembled such that the combined enclosure 100 may be readily disposed below grade without requiring additional installation steps on-site. However, in other examples, a user may assemble the portions of the heat exchanger 150 and/or couple the support bars 156 with the shell 110 at the desired location. The various components (e.g., the active networking component(s), the primary power source 106, the secondary power source 108, the overflow assembly 160, the coolant circulator 170, and/or the connection panel 180) may be placed within the respective first chamber 112 and/or the second chamber 120 before or after installing the enclosure 100 below-grade, while making any necessary connections using power and/or transmission cables 168. The dielectric fluid 101 may then be added to the first chamber 112, whereupon the first chamber 112 may be sealed using a door, lid, and/or any other suitable approach. It is to be appreciated that in some examples, the active networking component(s) 10 may be submerged within the dielectric fluid 101 prior to coupling the transmission cable(s) 168 therewith to assist with eliminating air bubbles. After the desired power and/or data connections are established, a user may activate the coolant circulator 170 and close the door 162.

Further, upon ensuring that the door 162 is sealed, a user may dispose the porous material 159 around the shell 110 and/or heat exchanger 150. More specifically, as illustrated in FIG. 1, a user may position the porous material between the shell 110 and the fins 153 and support bars 156 such that these components are surrounded, encapsulated, and/or otherwise covered thereby. As previously noted, the porous material, combined with the relatively lower subterranean temperatures as compared with ambient temperatures, may assist with efficiently removing thermal energy from the heat sink 151, thus resulting in more efficient operation of the electronic components within the enclosure 100.

The dielectric fluid 101 is routinely (e.g., periodically and/or constantly) cycled through the first chamber 112 via the coolant circulator 170. Thermally cooled dielectric fluid 101 enters the first chamber 112 via the coolant distribution line 140, whereupon it exits the elongated member 142 via the holes 144. The cooled dielectric fluid 101 then contacts the active networking component(s) 10, thereby drawing thermal energy therefrom to assist with effectively lowering the operating temperature of the active networking component(s). Because dielectric fluid 101 having a relatively higher temperature will rise, and because the volume of dielectric fluid 101 added to the first chamber 112 is greater than the upper height of the trough 162, the heated dielectric fluid 101 rises to the top of the first chamber 112 and cascades over the open upper end 162a of the trough 162.

The dielectric fluid 101 within the trough 162 then exits the trough 162 via the outlet 164, and travels (via fluid lines 172) to the inlet 174 of the fluid circulator 170. The coolant circulator 170 then forces or otherwise urges the dielectric fluid 101 through the outlet 176 and to the inlet 152 of the heat exchanger 150. The fluid circulator 170 urges this dielectric fluid 101 through the heat sink, which effectively dissipates thermal energy retained within the dielectric fluid 101. Last, the cooled dielectric fluid 101 exits the outlet 154 of the heat exchanger 150 and enters the coolant distribution line 140, where it continues the cycle of removing thermal energy created by the active networking component(s) as it passes by the equipment. As mentioned, this cooling process may be continuous, on-demand, and/or conducted at any desired interval.

In some arrangements, it is to be appreciated that some of the equipment may require slight modifications to ensure effective operation in a submerged environment. For example, some active networking component(s) 10 and/or power sources (e.g., the primary power source 106) may incorporate fans or other active cooling mechanisms that needn't operate given the use of liquid cooling approaches described herein. In such examples, a user may disable and/or program the electronics in a way that the component "thinks" the fan is operational despite being disengaged and/or otherwise deactivated. As a non-limiting example, the fans may be removed from the components, and relevant breakers and/or fuses may subsequently be shorted or otherwise disconnected to allow the components to work in a submerged environment. Other examples are possible.

In some examples, the enclosure 100 may be relatively maintenance-free after an initial installation process. For example, the coolant circulator 170 may use a replaceable filter member (not illustrated). In some examples, to ensure longevity of the coolant circulator 170, the filter and/or dielectric fluid 101 may be replaced after a brief installation period to accommodate for buildup of particles. After this initial installation period, the enclosure 100 may be capable of operating without user intervention for extended periods (e.g., approximately 20 years or more). However, it is to be appreciated that a user may access the "dry-side" components (e.g., those retained within or otherwise coupled with the second chamber 120) as needed to establish or modify connections or to swap out components. Such tasks will advantageously limit or avoid exposure to the "wet-side" components (e.g., those retained within or otherwise coupled with the first chamber 112) so as to limit unintended damage thereto.

So arranged, by forcing the dielectric fluid 101, which has a greater thermal density and thus increased capacity to retain heat compared with forced air, past the active networking components 10, the overall size of the enclosure 100 may be reduced. Additionally, such reduced enclosure 100 size, combined with the use of liquid cooling approaches, may reduce power consumption by up to approximately 50% as compared with conventional cooling approaches.

In some implementations, the enclosure 100 may include additional components that may assist with cooling the components and/or dielectric fluid 101. For example, any number of flow meters 190 may be coupled with the coolant circulator 170 to monitor the flow rate of the dielectric fluid 101. In the event the flow meter 190 senses a flow value outside of an acceptable threshold, the flow meter 190 may trigger an alarm 192 to alert the user of an issue. Other examples and/or arrangements are possible.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Numerous alternative examples could be implemented, using either current technology or technology developed after the filing date of this patent, which would still fall within the scope of the claims. Additionally, the described embodiments/examples/implementations should not be interpreted as mutually exclusive and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting example the term is defined to be within 10%, in another example within 5%, in another example within 1% and in another example within 0.5%. The term "coupled" as used herein is defined as connected, although not necessarily directly and not necessarily mechanically. A device or structure that is "configured" in a certain way is configured in at least that way, but may also be configured in ways that are not listed.

Further, unless expressly stated to the contrary, "or" refers to an inclusive or and not to an exclusive or. For example, "A, B or C" refers to any combination or subset of A, B, C such as (1) A alone, (2) B alone, (3) C alone, (4) A with B, (5) A with C, (6) B with C, and (7) A with B and with C. As used herein, the phrase "at least one of A and B" is intended to refer to any combination or subset of A and B such as (1) at least one A, (2) at least one B, and (3) at least one A and at least one B. Similarly, the phrase "at least one of A or B" is intended to refer to any combination or subset of A and B such as (1) at least one A, (2) at least one B, and (3) at least one A and at least one B.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus, the following claims are hereby incorporated into the Detailed Description, with each claim standing on its own as a separately claimed subject matter.

By way of example, and not limitation, the disclosure herein contemplates at least the following examples:

1. A subterranean enclosure for retaining at least one networking component, the subterranean enclosure comprising: a shell forming a first chamber and a second chamber, the shell including a plurality of sidewalls and being disposed in a subterranean environment; a dielectric fluid adapted to be disposed in the first chamber; a mounting mechanism at least partially disposed within the first chamber, the mounting mechanism including at least one coupling member adapted to retain at least one active networking component; a coolant distribution line at least partially disposed within the first chamber of the shell, the coolant distribution line including an elongated member halving at least one opening formed on a portion thereof; a coolant circulator at least partially disposed within the shell, the coolant circulator adapted to circulate the dielectric fluid within the first chamber of the shell via the coolant distribution line; and a heat exchanger operably coupled with the shell, the heat exchanger positioned near an exterior portion of the shell and being adapted to dissipate thermal energy from the dielectric fluid exiting the coolant circulator prior to the dielectric fluid entering the coolant distribution line, wherein the heat exchanger extends outwardly from the shell.

2. The subterranean enclosure of example 1, wherein the heat exchanger extends outwardly from the shell in a generally parallel direction to at least one of the plurality of sidewalls.

3. The subterranean enclosure of example 1 or 2, further comprising a porous material disposed between the shell and heat exchanger.

4. The subterranean enclosure of example 3, wherein the porous material comprises at least one of a gravel material or a fibrous material.

5. The subterranean enclosure of any one of examples 1-4, wherein the heat exchanger includes: at least one heat sink having a plurality of fins; and at least one support bar adapted to position the at least one heat sink a distance away from the plurality of sidewalls.

6. The subterranean enclosure of any one of examples 1-5, wherein the mounting mechanism is adapted to be submerged in the dielectric fluid.

7. The subterranean enclosure of any one of examples 1-6, further comprising a connection panel at least partially disposed in the second chamber of the shell, the connection adapted to be accessible by a user via a door.

8. The subterranean enclosure of example 7, further comprising at least one transmission cable, the at least one transmission cable adapted to operably couple with the at least one active networking component retained in the first chamber and the connection panel disposed in the second chamber.

9. The subterranean enclosure of any one of examples 1-8, further comprising a primary power source at least partially disposed within the first chamber, the primary power source adapted to be submerged in the dielectric fluid and to provide power to the at least one active networking component.

10. The subterranean enclosure of example 9, further comprising a secondary power source at least partially disposed within the second chamber, the secondary power source adapted to provide power to the at least one active networking component.

11. The subterranean enclosure of any one of examples 1-10, further including a cover adapted to seal the first chamber and the second chamber of the shell.

12. A method of assembling a subterranean enclosure for retaining at least one networking component, the method comprising: providing a shell forming a first chamber and a second chamber, the shell including a plurality of sidewalls; coupling a mounting mechanism with the first chamber of the shell, the mounting mechanism including at least one coupling member; disposing a coolant distribution line within the first chamber of the shell, the coolant distribution line including an elongated member having at least one opening formed on a portion thereof; coupling at least one active networking component with the mounting mechanism via the at least one coupling member; coupling a coolant circulator with the shell; coupling a heat exchanger with an exterior portion of the shell such that a gap is defined between the heat exchanger and at least one of the plurality of sidewalls, the heat exchanger being adapted to dissipate thermal energy from the dielectric fluid exiting the coolant circulator prior to the dielectric fluid entering the coolant distribution line; disposing the subterranean enclosure in a subterranean environment; and disposing a dielectric fluid within the first chamber of the shell such that the at least one active networking component is submerged by the dielectric fluid.

13. The method of example 12, further comprising the step of disposing a porous material between the shell and the heat exchanger.

14. The method of example 13, wherein the porous material comprises at least one of a gravel material or a fibrous material.

15. The method of any one of examples 12-14, wherein the heat exchanger includes: at least one heat sink having a plurality of fins; and at least one support bar adapted to position the at least one heat sink a distance away from the plurality of sidewalls.

16. The method of any one of examples 12-15, further including providing power to the at least one active networking component and the coolant circulator such that the dielectric fluid flows through the coolant distribution line.

17. The method of any one of examples 12-16, further comprising communicatively coupling, via a transmission cable, the at least one active networking component with a connection panel at least partially disposed in the second chamber of the shell.

18. The method of any one of examples 12-17, further comprising disposing a primary power source within the first chamber such that it is submerged in the dielectric fluid, the primary power source adapted to provide power to the at least one active networking component.

19. The method of example 18, further comprising disposing a secondary power source within the second chamber, the secondary power source adapted to provide power to the at least one active networking component.

Additionally, the benefits, advantages, solutions to problems, and any element(s) that may cause any benefit, advantage, or solution to occur or become more pronounced are not to be construed as a critical, required, or essential features or elements of any or all the claims.

Finally, any references, including, but not limited to, publications, patent applications, and patents cited herein are hereby incorporated in their entirety by reference to the same extent as if each reference were individually and specifically indicated to be incorporated by reference and were set forth in its entirety herein.

The patent claims at the end of this patent application are not intended to be construed under 35 U.S.C. § 112 (f) unless traditional means-plus-function language is expressly recited, such as "means for" or "step for" language being explicitly recited in the claim(s). The systems and methods described herein are directed to an improvement to computer functionality, and improve the functioning of conventional computers.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A subterranean enclosure for retaining at least one networking component, the subterranean enclosure comprising:
   a shell forming a first chamber and a second chamber, the shell including a plurality of sidewalls, wherein the first chamber is positioned adjacent to the second chamber and being separated by a partition and being disposed in a subterranean environment;
   a dielectric fluid adapted to be disposed in the first chamber;
   a mounting mechanism at least partially disposed within the first chamber, the mounting mechanism including at least one coupling member adapted to retain at least one active networking component;
   a coolant distribution line at least partially disposed within the first chamber of the shell, the coolant distribution line including an elongated member having at least one opening formed on a portion thereof;
   a coolant circulator at least partially disposed within the second chamber of the shell, the coolant circulator being fluidly coupled with the first chamber via at least one fluid line extending through the partition, the coolant circulator adapted to circulate the dielectric fluid within the first chamber of the shell via the coolant distribution line; and
   a heat exchanger operably coupled with the shell, the heat exchanger positioned near an exterior portion of the shell and being adapted to dissipate thermal energy from the dielectric fluid exiting the coolant circulator prior to the dielectric fluid entering the coolant distribution line, wherein the heat exchanger extends outwardly from the shell.

2. The subterranean enclosure of claim 1, wherein the heat exchanger extends outwardly from the shell in a generally parallel direction to at least one of the plurality of sidewalls.

3. The subterranean enclosure of claim 1, further comprising a porous material disposed between the shell and heat exchanger.

4. The subterranean enclosure of claim 1, wherein the heat exchanger includes:
   at least one heat sink having a plurality of fins; and
   at least one support bar adapted to position the at least one heat sink a distance away from the plurality of sidewalls.

5. The subterranean enclosure of claim 1, wherein the mounting mechanism is adapted to be submerged in the dielectric fluid.

6. The subterranean enclosure of claim 1, further comprising a connection panel at least partially disposed in the second chamber of the shell, the connection panel adapted to be accessible by a user via a door.

7. The subterranean enclosure of claim 6, further comprising at least one transmission cable, the at least one transmission cable adapted to operably couple with the at least one active networking component retained in the first chamber and the connection panel disposed in the second chamber.

8. The subterranean enclosure of claim 1, further comprising a primary power source at least partially disposed within the first chamber, the primary power source adapted to be submerged in the dielectric fluid and to provide power to the at least one active networking component.

9. The subterranean enclosure of claim 8, further comprising a secondary power source at least partially disposed within the second chamber, the secondary power source adapted to provide power to the at least one active networking component.

10. A method of assembling a subterranean enclosure for retaining at least one networking component, the method comprising:
    providing a shell forming a first chamber and a second chamber, the shell including a plurality of sidewalls, wherein the first chamber is positioned adjacent to the second chamber and being separated by a partition;
    coupling a mounting mechanism with the first chamber of the shell, the mounting mechanism including at least one coupling member;
    disposing a coolant distribution line within the first chamber of the shell, the coolant distribution line including an elongated member having at least one opening formed on a portion thereof;
    coupling at least one active networking component with the mounting mechanism via the at least one coupling member;
    coupling a coolant circulator within the second chamber of the shell;
    fluidly coupling the first chamber and the coolant circulator disposed within the second chamber via at least one fluid line extending through the partition;
    coupling a heat exchanger with an exterior portion of the shell such that a gap is defined between the heat exchanger and at least one of the plurality of sidewalls, the heat exchanger being adapted to dissipate thermal energy from a dielectric fluid exiting the coolant circulator prior to the dielectric fluid entering the coolant distribution line;
    disposing the subterranean enclosure in a subterranean environment; and
    disposing a dielectric fluid within the first chamber of the shell such that the at least one active networking component is submerged by the dielectric fluid.

11. The method of claim 10, further comprising the step of disposing a porous material between the shell and the heat exchanger.

12. The method of claim 11, wherein the porous material comprises at least one of a gravel material or a fibrous material.

13. The method of claim 10, wherein the heat exchanger includes:
   at least one heat sink having a plurality of fins; and
   at least one support bar adapted to position the at least one heat sink a distance away from the plurality of sidewalls.

14. The method of claim 10, further including providing power to the at least one active networking component and the coolant circulator such that the dielectric fluid flows through the coolant distribution line.

15. The method of claim 10, further comprising communicatively coupling, via a transmission cable, the at least one active networking component with a connection panel at least partially disposed in the second chamber of the shell.

16. The method of claim 10, further comprising disposing a primary power source within the first chamber such that it is submerged in the dielectric fluid, the primary power source adapted to provide power to the at least one active networking component.

17. The method of claim 16, further comprising disposing a secondary power source within the second chamber, the secondary power source adapted to provide power to the at least one active networking component.

18. The method of claim 10, further comprising the step of disposing an overflow assembly comprising a trough within the first chamber, the trough including an open upper end and an outlet fluidly coupled with the at least one fluid line, wherein the trough is adapted to receive the dielectric fluid disposed within the first chamber via the open upper end and exit the trough and the first chamber via the at least one fluid line.

19. The subterranean enclosure of claim 1, wherein the partition divides the shell such that first chamber is a wet-side and the second chamber is a dry-side, the divided shell enabling a user to access, modify, and/or create data connections in the second chamber with the at least one networking component while the at least one networking component is submerged in the dielectric fluid, and further wherein the coolant circulator is positioned within the dry-side second chamber to facilitate its repair and replacement without entering the wet-side first chamber.

20. The method of claim 10, wherein the heat exchanger extends outwardly from the shell, and further comprising disposing the heat exchanger in a manner to enhance thermal dissipation efficiency by utilizing the subterranean environment's cooler temperature.

* * * * *